(12) United States Patent
Singh et al.

(10) Patent No.: US 10,497,544 B2
(45) Date of Patent: Dec. 3, 2019

(54) COMPONENT OF A PLASMA PROCESSING APPARATUS HAVING A PROTECTIVE IN SITU FORMED LAYER ON A PLASMA EXPOSED SURFACE

(71) Applicant: Lam Research Corporation, Fremont, CA (US)

(72) Inventors: Harmeet Singh, Fremont, CA (US); Thorsten Lill, Santa Clara, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 633 days.

(21) Appl. No.: 15/245,711

(22) Filed: Aug. 24, 2016

(65) Prior Publication Data
US 2016/0365228 A1   Dec. 15, 2016

Related U.S. Application Data

(62) Division of application No. 13/888,754, filed on May 7, 2013, now Pat. No. 9,449,797.

(51) Int. Cl.
*H01J 37/32* (2006.01)
*H01L 21/67* (2006.01)
(Continued)

(52) U.S. Cl.
CPC .... *H01J 37/32495* (2013.01); *C23C 16/4404* (2013.01); *H01J 37/32477* (2013.01); *H01J 37/32715* (2013.01); *H01J 37/32724* (2013.01); *H01L 21/3065* (2013.01); *H01L 21/6715* (2013.01); *H01L 21/67069* (2013.01); *H01L 21/68735* (2013.01);
(Continued)

(58) Field of Classification Search
CPC .......... H01L 21/3065; H01L 21/67069; H01L 21/6715; H01L 21/68735; H01L 21/6833; H01L 21/68757; H01J 37/32495; H01J 37/32477; H01J 37/32715; H01J 37/32724; C23C 16/4404
See application file for complete search history.

(56) References Cited

U.S. PATENT DOCUMENTS 3,578,345 A    5/1971 Copes
5,998,932 A    12/1999 Lenz
(Continued)

FOREIGN PATENT DOCUMENTS

JP    2005072346 A    3/2005
JP    2008027657 A    2/2008
JP    20080135286 A   6/2008

OTHER PUBLICATIONS

First Japanese Office Action for Japanese Patent Application No. 2014-095127 dated Mar. 6, 2018.

*Primary Examiner* — Michael P Wieczorek

(57) ABSTRACT

A component of a plasma processing chamber having a protective liquid layer on a plasma exposed surface of the component The protective liquid layer can be replenished by supplying a liquid to a liquid channel and delivering the liquid through liquid feed passages in the component. The component can be an edge ring which surrounds a semiconductor substrate supported on a substrate support in a plasma processing apparatus wherein plasma is generated and used to process the semiconductor substrate. Alternatively, the protective liquid layer can be cured or cooled sufficiently to form a solid protective layer.

9 Claims, 10 Drawing Sheets

Figure 1B:
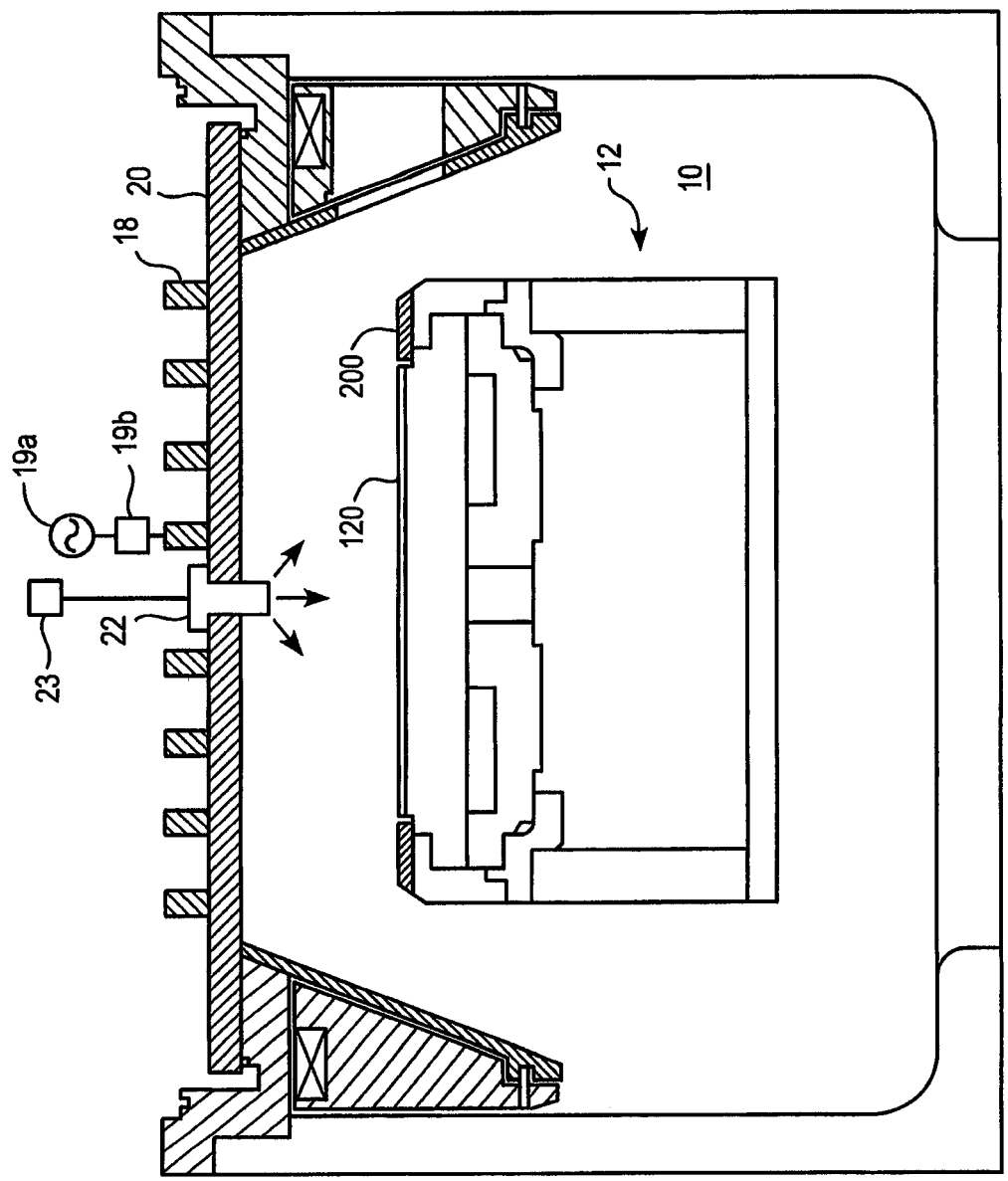

(51) Int. Cl.
*H01L 21/687* (2006.01)
*C23C 16/44* (2006.01)
*H01L 21/3065* (2006.01)

(52) U.S. Cl.
CPC . *H01J 2237/0203* (2013.01); *H01J 2237/332* (2013.01); *H01J 2237/334* (2013.01); *H01J 2237/3344* (2013.01)

(56) References Cited

U.S. PATENT DOCUMENTS

| | | | |
|---|---|---|---|
| 6,039,836 | A | 3/2000 | Dhindsa et al. |
| 6,383,931 | B1 | 5/2002 | Flanner et al. |
| 6,723,202 | B2 | 4/2004 | Nagaiwa et al. |
| 6,780,787 | B2 | 8/2004 | O'Donnell |
| 6,887,340 | B2 | 5/2005 | Dhindsa et al. |
| 7,028,696 | B2 | 4/2006 | Richardson et al. |
| 7,067,178 | B2 | 6/2006 | Muto |
| 7,125,500 | B2 | 10/2006 | Farrand et al. |
| 7,244,336 | B2 | 7/2007 | Fischer et al. |
| 7,572,737 | B1 | 8/2009 | Dhindsa |
| 7,605,086 | B2 * | 10/2009 | O'Donnell ........ H01J 37/32467 427/447 |
| 7,658,816 | B2 | 2/2010 | Koshiishi et al. |
| 7,713,380 | B2 | 5/2010 | Chen et al. |
| 7,767,584 | B1 | 8/2010 | Singh et al. |
| 7,837,827 | B2 | 11/2010 | Dhindsa et al. |
| 7,842,637 | B2 | 11/2010 | Ebron et al. |
| 7,854,820 | B2 | 12/2010 | de la Llera et al. |
| 7,862,682 | B2 | 1/2011 | Stevenson et al. |
| 8,025,731 | B2 | 9/2011 | Ni et al. |
| 8,084,375 | B2 | 12/2011 | Koshiishi et al. |
| 8,211,324 | B2 | 7/2012 | Dhindsa et al. |
| 8,222,574 | B2 | 7/2012 | Sorabji et al. |
| 5,998,932 | C1 | 12/2012 | Lenz |
| 2007/0283884 | A1 | 12/2007 | Tiller et al. |
| 2009/0200269 | A1 | 8/2009 | Kadkhodayan |
| 2010/0065216 | A1 | 3/2010 | Tiller et al. |

* cited by examiner

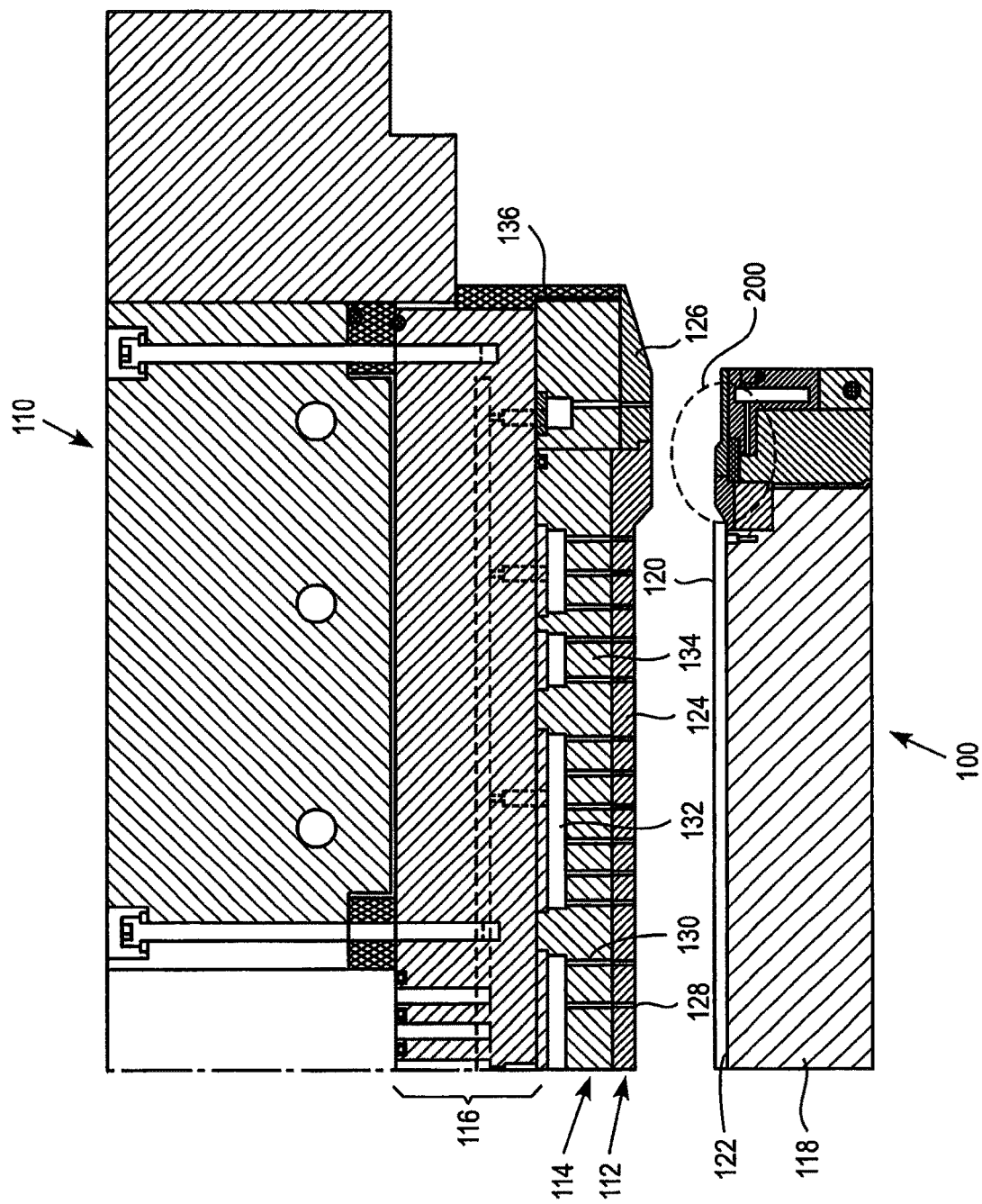

COMPONENT OF A PLASMA PROCESSING APPARATUS HAVING A PROTECTIVE IN SITU FORMED LAYER ON A PLASMA EXPOSED SURFACE

This application is a divisional patent application of U.S. patent application Ser. No. 13/888,754, filed May 7, 2013, the entire contents of which is hereby incorporated by reference.

FIELD OF THE INVENTION

The present invention relates to a component such as an edge ring for use in a plasma processing chamber of a plasma processing apparatus. More specifically the invention relates to a component such as an edge ring having a protective liquid layer on at least one plasma exposed surface thereof wherein a plasma compatible liquid forming the protective liquid layer is replenished in situ during plasma processing.

BACKGROUND

Plasma processing apparatuses are used to process semiconductor substrates by techniques including etching, physical vapor deposition (PVD), chemical vapor deposition (CVD), and resist removal. One type of plasma processing apparatus used in plasma processing includes a reaction chamber containing top and bottom electrodes. A radio frequency (RF) power is applied between the electrodes to excite a process gas into a plasma for processing semiconductor substrates in the reaction chamber.

One challenge facing designers of plasma processing chambers is that the plasma etch conditions create significant ion bombardment of the surfaces of the processing chamber that are exposed to the plasma. This ion bombardment, combined with plasma chemistries and/or etch byproducts, can produce significant erosion, corrosion and corrosion-erosion of the plasma-exposed surfaces of the processing chamber. Another challenge is to control heat transfer across a bottom electrode assembly and a semiconductor substrate (e.g., silicon substrate), in particular, to make the temperature at the center of the substrate equal to the temperature at the edge of the substrate, or alternatively, to make a desired temperature profile across the substrate. To alleviate such challenges, an edge ring assembly is implemented, fitting around the substrate.

SUMMARY

Disclosed herein is a component of a plasma processing chamber wherein plasma is generated and used to process a semiconductor substrate. The component comprises at least one plasma exposed surface and means for supplying a plasma compatible liquid to the plasma exposed surface thereof so as to form a protective layer thereon.

Also disclosed herein is a method of forming a protective liquid layer on a plasma exposed surface of a component in a plasma processing apparatus while processing a semiconductor substrate in a vacuum chamber. The method comprises supplying plasma compatible liquid from a liquid supply to the plasma exposed surface of the component so as to form a protective liquid layer on the plasma exposed surface of the component. The liquid forming the protective liquid layer is replenished in situ to the plasma exposed surface of the component during plasma processing of a semiconductor substrate in the vacuum chamber.

Also disclosed herein is a method of forming an in situ protective solid layer on a plasma exposed surface of a component in a plasma processing apparatus configured to process a semiconductor substrate in a vacuum chamber. The method comprises supplying plasma compatible liquid from a liquid supply to the plasma exposed surface of the component so as to form a protective liquid layer on the plasma exposed surface of the component. The protective liquid layer is cured on the plasma exposed surface of the component thereby forming the protective solid layer wherein the liquid forming the protective liquid layer is a curable liquid.

Also disclosed herein is a method of forming an in situ protective solid layer on a plasma exposed surface of a component in a plasma processing apparatus configured to process a semiconductor substrate in a vacuum chamber. The method comprises heating a plasma compatible solid to form a plasma compatible liquid, and supplying the plasma compatible liquid to the plasma exposed surface of the component so as to form a protective liquid layer on the plasma exposed surface of the component. The protective liquid layer on the plasma exposed surface of the component is cooled, thereby forming the protective solid layer.

BRIEF DESCRIPTION OF THE DRAWING FIGURES

FIG. 1A illustrates a portion of an embodiment of a showerhead electrode assembly and a substrate support for a plasma processing apparatus wherein embodiments presented herein may be practiced. FIG. 1B illustrates an embodiment of an inductively coupled plasma processing apparatus wherein embodiments presented herein may be practiced.

FIGS. 2A-J each illustrate a cross section of an embodiment of an edge ring assembly including means for supplying a plasma compatible liquid to a plasma exposed surface thereof to form a protective liquid layer thereon.

FIG. 3A-D each illustrate a cross section of an embodiment of a substrate support including means for supplying a plasma compatible liquid to a plasma exposed surface thereof to form a protective liquid layer thereon.

DETAILED DESCRIPTION

The manufacturing of the integrated circuit devices includes the use of plasma processing apparatuses. A plasma processing apparatus can include a vacuum chamber, and may be configured to etch selected layers of a semiconductor substrate or deposit material upon a surface of a semiconductor substrate.

An etching process may contain several steps in which elements of pressure, process gas, and power are combined in order to produce excited chemical species within the vacuum chamber. The excited chemical species of the etchant gas mixture, otherwise known as a plasma, contain radicals, ions, and neutrals which interact to varying degrees with exposed areas on the substrate, that is areas which are not covered and protected by a hardmask or photoresist. The interaction of elements of the plasma with the exposed material of the substrate effectively removes material in the uncovered region. The use of bias voltage provides directionality of ions accelerated toward the surface, thus providing substantial anisotropic etching. Features such as via holes and trenches can be formed in a complex stack of layers on the substrate using anisotropic etching in which sidewalls of the features can be protected from etching reaction by a passivation layer formed thereon. The etch gas typically contains a halogen containing gas for chemical etching and an oxygen containing gas for passivation. The passivation layer can be polymer based or an oxide film containing silicon oxide ($SiO_x$-based film) formed by deposition on or oxidation of the feature sidewalls.

Deposition processes can include atomic layer deposition or plasma enhanced chemical vapor deposition wherein dielectric or conductive films are deposited on the substrate. Deposited species are formed after plasma is generated as a result of chemical reactions between gaseous reactants at elevated temperatures in the vicinity of the substrate wherein dielectric or conductive films are formed.

One challenge facing designers of plasma processing apparatuses is that the plasma processing conditions can create significant ion bombardment of surfaces of a vacuum chamber that are exposed to the plasma. This ion bombardment, combined with plasma chemistries and/or etch byproducts, can produce significant erosion, corrosion and corrosion-erosion of the plasma-exposed surfaces of the vacuum chamber. As a result, surface materials are removed by physical and/or chemical attack, including erosion, corrosion and/or corrosion-erosion. This attack causes problems including short part lifetimes, increased part costs, particulate contamination, on-substrate transition metal contamination, and process drift. Parts with relatively short lifetimes are commonly referred to as consumables. Short lifetimes of consumable parts increase the cost of ownership as well as processing down time as replacing consumable parts is time consuming.

Another challenge is to control etch rate uniformity across a semiconductor substrate (e.g., silicon substrate), in particular, to make the etch rate at the center of the substrate equal to the etch rate at the edge. Therefore, substrate boundary conditions are preferably designed for achieving uniformity across the substrate in regard to parameters such as process gas composition, process gas pressure, substrate temperature, RF power, and plasma density.

Some plasma processing apparatuses are designed to have an RF power applied to a powered electrode underlying an electrostatic clamping electrode (ESC), both of which are incorporated in a substrate support assembly that supports a semiconductor substrate undergoing plasma processing. However, during plasma processing, a nonuniform processing of the substrate can be caused by a nonuniform plasma density. A nonuniform plasma density can be caused because the outer edge of the substrate may overhang the bottom electrode, and/or the RF impedance path from the powered electrode through the electrostatic clamping electrode and substrate to the plasma can be different than the RF impedance path from an outer portion of the powered electrode to the plasma. Improved plasma uniformity can be achieved by providing an RF impedance path which is similar at the center and edge of a substrate undergoing plasma processing. Additionally, improved plasma uniformity can be achieved by providing a more uniform temperature distribution at the center and edge of a substrate undergoing plasma processing.

An upper edge ring can shield one or more underlying coupling rings in an edge ring assembly from plasma attack. The edge ring is a consumable part and requires regular cleaning and/or replacement. It is desirable to extend the lifetime of the edge ring, which extends the lifetime of the edge ring assembly, increases mean time between cleaning and/or replacement, and decreases the cost of ownership. Components with extended RF lifetimes are described herein. To alleviate such aforementioned nonuniformities and to extend the RE lifetime of a component, such as an edge ring assembly, the component can include means for supplying a protective liquid layer on a plasma exposed surface thereof. For example, the component can be an upper edge ring which includes the protective liquid layer on at least one plasma exposed surface, and more preferably on each plasma exposed surface thereof. The protective liquid layer is formed from a plasma compatible liquid wherein the liquid is supplied from a liquid supply to the edge ring. As used herein, "plasma exposed surface" means at least one plasma exposed surface.

The plasma compatible liquid is preferably supplied from a liquid supply to a liquid channel in the component. The means for supplying the liquid comprises feed passages which deliver the liquid to at least one plasma exposed surface of the component. The feed passages in the component which supply the liquid can be pores of a porous ceramic material, or alternatively, holes formed in the component. During plasma processing of a semiconductor substrate, the protective liquid layer can be replenished in situ to the plasma exposed surfaces of the component. For example, an upper edge ring can include the protective liquid layer wherein the liquid forming the protective liquid layer is replenished in situ, thus extending the RF lifetime of the edge ring. In a first embodiment the protective liquid layer remains in a liquid form. In a second embodiment the protective liquid layer is curable wherein the protective liquid layer is transformed into a solid form before a batch of semiconductor substrates are processed. Compared to edge rings which must be replaced after a certain length of exposure to RF plasma conditions, which erode the edge ring (e.g. replacement of edge rings requires shut down of the processing chamber to allow manual replacement of the edge ring with a loss of up to 10 hours in production time), the protective liquid layer can prevent erosion of the edge ring and thus provide an erosionless edge ring.

The etch rate near the edge of the semiconductor substrate can be controlled by modifying a quartz coupling ring to increase cooling of the edge ring assembly. The edge ring assembly can be heat sunk to a temperature controlled base plate comprised in the substrate support assembly. To increase thermal conductivity between an edge ring assembly and the temperature controlled base plate, thermal interface material can be disposed between the rings within the edge ring assembly. In this case, a thermally conductive elastomer may bond adjacent rings in the edge ring assembly. An exemplary embodiment of an edge ring assembly heat sunk to a temperature controlled base plate wherein the edge ring assembly comprises thermally conductive elastomer bonds may be found in commonly-assigned U.S. Pat. No. 7,244,336, which is incorporated herein in its entirety.

The plasma compatible liquid supplied to plasma exposed surfaces of the edge ring assembly forming the protective liquid layer may be circulated through a heat exchanger such that the liquid can maintain the temperature of the upper edge ring at a desired temperature and thus avoid process drift. For example, the liquid may be temperature controlled by passing it through a heat exchanger during plasma processing such that the upper edge ring is maintained at a desired temperature.

Other challenges in controlling etch rate uniformity across a semiconductor substrate (e.g., silicon substrate), in particular, to make the etch rate at the center of the substrate equal to the etch rate at the edge are parameters such as process gas composition, process gas pressure, substrate temperature, RF power, and plasma density.

To alleviate nonuniformities, such as an uneven RF impedance path, an edge ring assembly including a protective liquid layer can been implemented, fitting around a substrate support assembly wherein the edge ring assembly includes one or more embedded RF electrodes. Improved plasma uniformity can be achieved by providing an RF impedance path which is similar at the center and edge of a substrate undergoing plasma processing. The RF impedance path can be manipulated by choice of materials, and/or dimensions of the rings in the edge ring assembly. The rings in the edge ring assembly may each be formed from a single material or a base material having one or more coatings of conductive, semiconductive, or dielectric material, including and not limited to alumina, silicon oxide, quartz, aluminum oxide, silicon, silicon carbide, YAG, yttrium oxide, yttrium fluoride, cerium oxide, aluminum nitride, graphite, or a combination thereof. An exemplary embodiment of an edge ring assembly comprising an upper edge ring provided with an RF voltage control arrangement may be found in commonly-assigned U.S. Pat. No. 8,211,324, which is incorporated in its entirety herein.

The component, such as an upper edge ring in an edge ring assembly, includes a protective liquid layer on at least one plasma exposed surface and more preferably on each plasma exposed surface of the component. The protective liquid layer is formed from one or more liquids. Preferably the liquid or liquids are ionic fluids. The liquid or liquids are high purity plasma compatible liquids, and can be a flowable oxide precursors and/or silicone based liquids (oils). Preferably the liquid or liquids have a low vapor pressure, such as a vapor pressure less than about $10^{-6}$ torr at about 20° C. in an embodiment, the silicone based liquid can be cured to form a high purity silicone oxide solid protective layer. The liquid can also be a perfluoropolyether. For example, liquids forming the protective liquid layer can be phenylmethyl siloxane, dimethyl cyclosiloxane, tetramethyl tetraphenyl trisiloxane, pentaphenyl trimethyl trisiloxane, 1-ethyl-3-methylimidazolium bis{(trifluoromethyl)sul-fonyl}amide, 1-octyl-3-methylimidazolium bis (trifluoromethanesulfonyl) imide, 1-butyl-3-methylimidazolium dicyanamide, hydrofluoroethylene, tetrafluoroethylene, perfluorotrimethyleneoxide, 1-ethyl-3-methylimidazolium chloride, 1-ethyl-3-methylimidazolium dicyanamide, 1-butyl-3,5-dimethylpyridinium bromide, 1-Butyl-3-methylimidazolium hexafluorophosphate, 1-Butyl-3-methylimidazolium hydrogen sulfate, 1-Butyl-3-methylimidazolium iodide, 1-Butyl-3-methylimidazolium methanesulfonate, 1-Butyl-3-methylimidazolium methyl carbonate, 1-Butyl-3-methylimidazolium methyl sulfate, 1-Butyl-3-methylimidazolium nitrate, 1-Butyl-3-methylimidazolium octyl sulfate, 1-Butyl-3-methylimidazolium tetrachloroaluminate, 1-Butyl-3-methylimidazolium tetrafluoroborate, 1-Butyl-3-methylimidazolium tetrafluoroborate, 1-Butyl-3-methylimidazolium thiocyanate, 1-Butyl-3-methylimidazolium tosylate, 1-Butyl-3-methylimidazolium trifluoroacetate, 1-Butyl-3-methylimidazolium trifluoromethanesulfonate, 1-(3-Cyanopropyl)-3-methylimidazolium bis(trifluoromethylsulfonyl)amide, 1-(3-Cyanopropyl)-3-methylimidazolium chloride, 1-(3-Cyanopropyl)-3-methylimidazolium dicyanamide, 1-Decyl-3-methylimidazolium chloride, 1-Decyl-3-methylimidazolium tetrafluoroborate, 1,3-Diethoxyimidazolium bis(trifluoromethylsulfonyl)imide, 1,3-Diethoxyimidazolium hexafluorophosphate, 1,3-Dihydroxyimidazolium bis(trifluoromethylsulfonyl)imide, 1,3-Dihydroxy-2-methylimidazolium bis (trifluoromethylsulfonyl)imide, 1,3-Dimethoxylmidazolium bis(trifluoromethyl-sulfonyl)imide, 1,3-Diethoxyimidazolium hexafluorophosphate, 1,3-Dimethoxy-2-methylimidazolium bis(trifluoromethylsulfonyl)imide, 1,3-Dimethoxy-2-methylimidazolium hexafluorophosphate, 1,3-Dimethylimidazolium dimethyl phosphate, 1,3-Dimethylimidazolium methanesulfonate, 1,3-Dimethylimidazolium methyl sulfate, 1,2-Dimethyl-3-propylimidazolium bis(trifluoromethylsulfonyl)imide, 1,2-Dimethyl-3-propylimidazolium tris (trifluoromethylsulfonyl)methide, 1-Dodecyl-3-methylimidazolium iodide, 1-Ethyl-2,3-dimethylimidazolium tetrafluoroborate, 1-Ethyl-2,3-dimethylimidazolium chloride, 1-Ethyl-2,3-dimethylimidazolium ethyl sulfate, 1-Ethyl-2,3-dimethylimidazolium hexafluorophosphate, 1-Ethyl-2,3-dimethylimidazolium methyl carbonate, 1-Ethyl-3-methylimidazolium acetate, 1-Ethyl-3-methylimidazolium aminoacetate, 1-Ethyl-3-methylimidazolium (S)-2-aminopropionate, 1-Ethyl-3-methylimidazolium bis(pentafluoroethylsulfonyl)imide, 1-Ethyl-3-methylimidazolium bis(trifluoromethylsulfonyl)imide, 1-Ethyl-3-methylimidazolium bromide, 1-Ethyl-3-methylimidazolium chloride, 1-Ethyl-3-methylimidazolium dibutyl phosphate, 1-Ethyl-3-methylimidazolium diethyl phosphate, 1-Ethyl-3-methylimidazolium dimethyl phosphate, 1-Ethyl-3-methylimidazolium ethyl sulfate, 1-Ethyl-3-methylimidazolium hexafluorophosphate, 1-Ethyl-3-methylimidazolium hydrogen carbonate, 1-Ethyl-3-methylimidazolium hydrogencarbonate solution, 1-Ethyl-3-methylimidazolium hydrogen sulfate, 1-Ethyl-3-methylimidazolium hydroxide solution, 1-Ethyl-3-methylimidazolium iodide, 1-Ethyl-3-methylimidazolium L-(+)-lactate, 1-Ethyl-3-methylimidazolium methanesulfonate, 1-Ethyl-3-methyl-imidazolium methyl carbonate solution, 1-Ethyl-3-methylimidazolium methyl sulfate, 1-Ethyl-3-methylimidazolium nitrate, 1-Ethyl-3-methylimidazolium tetrachloroaluminate, 1-Ethyl-3-methylimidazolium tetrachloroaluminate, 1-Ethyl-3-methylimidazolium tetrafluoroborate, 1-Ethyl-3-methylimidazolium 1,1,2,2-tetrafluoroethanesulfonate, 1-Ethyl-3-methylimidazolium thiocyanate, 1-Ethyl-3-methylimidazolium tosylate, 1-Ethyl-3-methylimidazolium trifluoromethanesulfonate, 1-Hexyl-3-methylimidazolium bis(trifluortnethylsulfonyl)imide, 1-Hexyl-3-methylimidazolium chloride, 1-Hexyl-3-methylimidazolium hexafluorophosphate, 1-Hexyl-3-methylimidazolium iodide, 1-Hexyl-3-methylimidazolium tetrafluoroborate, 1-Hexyl-3-methylimidazolium trifluoromethansulfonate, 1-(2-Hydroxyethyl)-3-methylimidazolium dicyanamide, 1-Methylimidazolium chloride, 1-Methylimidazolium hydrogen sulfate, 1-Methyl-3-octylimidazolium chloride, 1-Methyl-3-octylimidazolium hexafluorophosphate, 1-Methyl-3-octylimidazolium tetrafluoroborate, 1-Methyl-3-octylimidazolium trifluoromethanesulfonate, 1-Methyl-3-propylimidazolium iodide, 1-Methyl-3-propylimidazolium methyl carbonate solution, 1-Methyl-3-(3,3,4,4,5,5,6,6,7,7,8,8,8-tridecafluorooctyl) imidazolium hexafluorophosphate, 1-Methyl-3-vinylimidazolium methyl carbonate solution, 1,2,3-Trimethylimidazolium methyl sulfate, 1,2,3-Trimethylimidazolium trifluoromethanesulfonate purum, 1-Butyl-3-methylimidazolium acetate, 1-Butyl-3-methylimidazolium chloride, 1-Butyl-3-methylimidazolium hydrogen sulfate, 1-Butyl-3-methylimidazolium methanesulfonate, 1-Butyl-3-methylimidazolium methyl sulfate, 1-Butyl-3-methylimidazolium tetrafluoroborate, 1-Butyl-3-methylimidazolium thiocyanate, 1-Butyl-3-methylimidazolium trifluoromethanesulfonate, 1-Ethyl-2,3-dimethylimidazolium ethyl sulfate, 1-Ethyl-3-methylimidazolium acetate, 1-Ethyl-3-methylimidazolium chloride, 1-Ethyl-3-methylimidazolium dicyanamide, 1-Ethyl-3-methylimidazolium diethyl phosphate, 1-Ethyl-3-methylimidazolium ethyl sulfate, 1-Ethyl-3-methylimidazolium hydrogen sulfate,1-Ethyl-3-methylimidazolium hydroxide solution, 1-Ethyl-3-methylimidazolium methanesulfonate, 1-Ethyl-3-methylimidazolium tetrachloroaluminate, 1-Ethyl-3-methylimidazolium tetrafluoroborate, 1-Ethyl-3-methylimidazolium thiocyanate, 1-Ethyl-3-methylimidazolium trifluoromethanesulfonate, 1-Methylimidazolium chloride, 1-Methylimidazolium hydrogen sulfate, α,α-[(Methyl-9-octadecenyliminio)di-2,1-ethanediyl]bis[ω-hydroxy-poly(oxy-1,2-ethanediyl)] methyl sulfate, 1,2,3-Trimethylimidazolium methyl sulfate, 1,2,4-Trimethylpyrazolium methylsulfate, Tetrabutylphosphonium methanesulfonate, Tetrabutylphosphonium tetrafluoroborate, Tetrabutylphosphonium p-toluenesulfonate, Tributylmethylphosphonium dibutyl phosphate, Tributylmethylphosphonium methyl carbonate solution, Tributylmethylphosphonium methyl sulfate, Triethylmethylphosphonium dibutyl phosphate, Trihexyltetradecylphosphonium bis(trifluoromethylsulfonyl)amide, Trihexyltetradecylphosphonium bis(2,4,4-trimethylpentyl)phosphinate, Trihexyltetradecylphosphonium bromide, Trihexyltetradecylphosphonium chloride, Trihexyltetradecylphosphonium decanoate, Trihexyltetradecylphosphonium dicyanamide, 3-(Triphenylphosphonio)propane-1-sulfonate, 3-(Triphenylphosphonio)propane-1-sulfonic acid tosylate, 1-Butyl-1-methylpiperidinium tetrafluoroborate, 1-Butyl-1-methylpiperidinium bis(trifluoromethylsulfonyl)imide, 1-Butyl-1-methylpiperidinium hexafluorophosphate, 4-Ethyl-4-methylmorpholinium methyl carbonate solution, 1,2,3-Tris(diethylamino)cyclopropenylium bis(trifluoromethanesulfonyl)imide, 1,2,3-Tris(diethylamino)cyclopropenylium dicyanamide, Cyclopropyldiphenylsulfonium tetrafluoroborate, Triethylsulfonium bis(trifluoromethylsulfonyl)imide, 1-Butyl-1-methylpyrrolidinium bis(trifluoromethylsulfonyl)imide, 1-Butyl-1-methylpyrrolidinium bromide, 1-Butyl-1-methylpyrrolidinium chloride, 1-Butyl-1-methylpyrrolidinium dicyanamide, 1-Butyl-1-methylpyrrolidinium hexafluorophosphate, 1-Butyl-1-methylpyrrolidinium iodide, 1-Butyl-1-methylpyrrolidinium methyl carbonate solution, 1-Butyl-1-methylpyrrolidinium tetrafluoroborate, 1-Butyl-1-methylpyrrolidinium trifluoromethanesulfonate, 1-Ethyl-1-methylpyrrolidinium bis(trifluoromethylsulfonyl)imide, 1-Ethyl-1-methylpyrrolidinium bromide, 1-Ethyl-1-methylpyrrolidinium hexafluorophosphate, 1-Ethyl-1-methylpyrrolidinium tetrafluoroborate, 1-Butyl-3-methylpyridinium bis(trifluoromethylsulfonyl)imide, 1-Butyl-4-methylpyridinium hexafluorophosphate, 1-Butyl-4-methylpyridinium iodide, 1-Butyl-4-methylpyridinium tetrafluoroborate, 1-Butylpyridinium bromide, 1-(3-Cyanopropyl)pyridinium bis(trifluoromethylsulfonyl)imide, 1-(3-Cyanopropyl)pyridinium chloride, 1-Ethylpyridinium tetrafluoroborate, N-Ethylpyridinium bromide-d10, 3-Methyl-1-propylpyridinium bis(trifluoromethylsulfonyl)imide, 1,2,4-Trimethylpyrazolium methylsulfate, 1-Ethyl-3-methylimidazolium chloride, 1-Butyl-3-methylimidazolium chloride, 1-Ethyl-3-methyl imidazolium methanesulfonate, 1-Ethyl-3-methyl imidazolium ethylsulfate, 1-Ethyl-3-methyl imidazolium diethylphosphate, 1-Ethyl-3-methyl imidazolium dicyanamide, 1-Ethyl-3-methyl imidazolium acetate, Tris-(2-hydroxyethyl)-methylammonium methylsulfate, 1-Ethyl-3-methyl imidazolium thiocyanate, 1-Ethyl-3-methyl imidazolium tetrafluoroborate, 1-Ethyl-3-methyl imidazolium triflourmethanesulfonate, 1-Ethyl-3-methyl imidazolium bis (trifluomethylsulfonyl)imide, 1-Ethyl-3-methyl imidazolium methylcarbonate, 1-Butyl-3-methyl imidazolium methylcarbonate, Benzyldimethyltetradecylammonium chloride anhydrous, Benzyltrimethylammonium tribromide purum, Butyltrimethylammonium bis(trifluoromethylsulfonyl)imide, Diethylmethyl(2-methoxyethyl)ammonium bis(trifluoromethylsulfonyl)imide, Ethyldimethylpropylammonium bis(trifluoromethylsulfonyl)imide, 2-Hydroxyethyl-trimethylammonium L-(+)-lactate, Methyltrioctadecylammonium bromide, Methyl-trioctylammonium bis(trifluoromethylsulfonyl)imide, Methyltrioctylammonium bis(trifluoromethylsulfonyl)imide, Methyltrioctylammonium hydrogen sulfate, Methyltrioctylammonium thiosalicylate, Tetrabutylammonium benzoate, Tetrabutylammonium bis-trifluoromethanesulfonimidate, Tetrabutylammonium heptadecafluorooctanesulfonate, Tetrabutylammonium hydroxide 30-hydrate, Tetrabutylammonium methanesulfonate purum, Tetrabutylammonium nitrite, Tetrabutylammonium nonafluorobutanesulfonate, Tetrabutylammonium succinimide, Tetrabutylammonium thiophenolate, Tetrabutylammonium tribromide purum, Tetrabutylammonium triiodide, Tetradodecylammonium bromide, Tetradodecylammonium chloride, Tetrahexadecylammonium bromide purum, Tetrahexylammonium bromide purum, Tetrahexylammonium hydrogensulfate, Tetrahexylammonium iodide, Tetrahexylammonium tetrafluoroborate, Tetrakis(decyl)ammonium bromide, Tetramethylammonium hydroxide pentahydrate, Tetraoctylammonium bromide purum, Tributylmethylammonium chloride, Tributylmethylammonium dibutyl phosphate, Tributylmethylammonium methyl carbonate, Tributylmethylammonium methyl sulfate, Tris(2-hydroxyethyl)methylammonium methylsulfate, Triethylmethylammonium dibutyl phosphate, Triethylmethylammonium methyl carbonate, Cholin acetate, 1-Allyl-3-methylimidazolium bis(trifluoromethylsulfonyl)imide, 1-Allyl-3-methylimidazolium bromide, 1-Allyl-3-methylimidazolium chloride, 1-Allyl-3-methylimidazolium dicyanamide, 1-Allyl-3-methylimidazolium iodide, 1-Benzyl-3-methylimidazolium chloride, 1-Benzyl-3-methylimidazolium hexafluorophosphate, 1-Benzyl-3-methylimidazolium tetrafluoroborate, 1,3-Bis(cyanomethyl) imidazolium bis(trifluoromethylsulfonyl)imide, 1,3-Bis(cyanomethyl)imidazolium chloride purum, 1-Butyl-2,3-dimethylimidazolium chloride, 1-Butyl-2,3-dimethylimidazolium hexafluorophosphate, 1-Butyl-2,3-dimethylimidazolium tetrafluoroborate, 4-(3-Butyl-1-imidazolio)-1-butanesulfonate, 4-(3-Butyl-1-imidazolio)-1-butanesulfonic acid triflate, 1-Butyl-3-methylimidazolium acetate, 1-Butyl-3-methylimidazolium bis(trifluoromethylsulfonyl)imide, 1-Butyl-3-methylimidazolium bromide, 1-Butyl-3-methylimidazolium chloride, 1-Butyl-3-methylimidazolium dibutyl phosphate, 1-Butyl-3-methylimidazolium hexafluoroantimonate, 1-Butyl-3-methylimidazolium hydrogen sulfate, 1-butyl-3-methylimidazolium hexafluorophosphate, and mixtures thereof. Preferably the plasma compatible liquid or liquids have a molecular weight of about 800 to 5,000 g/mol, and more preferably the molecular weight of the liquid or liquids is greater than about 1,000 g/mol.

The plasma compatible liquid or liquids are preferably stored in a liquid supply, wherein the liquid or liquids are configured to be supplied to plasma exposed surfaces of the component, such as a plasma exposed surface of an edge ring assembly, to form a protective liquid layer thereon before and/or during processing of semiconductor substrates. The liquid or liquids which are supplied can be determined by a process recipe. For example, a liquid may be selected for a specific processing step based on which process gases are selected for the specific processing step. In an alternate embodiment, the liquid supplied to plasma exposed surface of the edge ring assembly may be curable such that the protective liquid layer can form a solid protective layer. For example, the curing can be performed by UV exposure from the plasma thereby forming the solid protective layer, or alternatively, two liquids can be supplied to the plasma exposed surface of the component wherein the two liquids react on the plasma exposed surface of the component to form the solid protective layer.

The liquid forming the protective liquid layer on a plasma exposed surface of the component is preferably a dielectric liquid. The dielectric, liquid can change the electrical properties of component including the protective liquid layer formed from the dielectric liquid. For example, the dielectric liquid can act as an insulator, causing the voltage across the component to drop if the component is electrically conductive, or alternatively can change the dielectric constant of a dielectric component. The liquid forming the protective liquid layer on a plasma exposed surface of the component additionally forms a liquid-plasma interface.

In an embodiment the liquid forming the protective liquid layer is configured to be circulated during plasma processing. The liquid can be supplied to a plasma exposed surface of the component and returned to the liquid supply, or in an alternate embodiment, the liquid can be supplied to a liquid channel of the component wherein the liquid channel is in fluid communication with a plasma exposed surface of the component. As illustrated in FIG. 2H, the liquid can be circulated through a heat exchanger 325 thereby maintaining the plasma exposed surface of the component at a controlled temperature. In another preferred embodiment the liquid may be circulated through a filter 326 such that impurities in the liquid resulting from processing of semiconductor substrates are removed. Further, because liquid at the liquid-plasma interface becomes charged from plasma exposure during plasma processing processes, the liquid may be circulated through an electrical discharge conduit 328 which removes charge built up in the liquid due to exposure to the plasma during plasma processing procedures.

FIG. 1A illustrates an exemplary embodiment of a showerhead electrode assembly 110 and substrate support assembly 100 for a vacuum chamber of a plasma processing apparatus in Which semiconductor substrates, e.g., silicon wafers, are processed, and wherein components comprising a protective liquid layer on a plasma exposed surface thereof, as discussed herein, may be used. Preferably, the component includes a liquid channel and is configured to supply plasma compatible liquid through feed passages to a plasma exposed surface of the component. The feed passages can be configured to wick the liquid therethrough. An exemplary component which includes means for supplying a liquid to a plasma exposed surface thereof can be an upper edge ring of an edge ring assembly, which surrounds a substrate support 118 and/or a semiconductor substrate 120 supported on the substrate support 118. The showerhead electrode assembly 110 can include a showerhead electrode including a top electrode 112 having gas passages 128, a backing member 114 having gas passages 130 aligned with passages 128 secured to the top electrode 112, and a thermal control plate 116 surrounded by guard ring 136. Details of such arrangements can be found in commonly-assigned U.S. Pat. Nos. 7,862,682, 7,854,820 and 7,125,500, incorporated herein by reference. The substrate support assembly 100 includes a substrate support 118 (only a portion of which is shown in FIG. 1A) including a bottom electrode and an electrostatic clamping electrode (e.g., electrostatic chuck) which is positioned beneath the top electrode 112 in the vacuum chamber. A substrate 120 subjected to plasma processing is electrostatically clamped on a substrate support surface 122 of the substrate support 118 (e.g., an electrostatic chuck).

In a vacuum chamber of a capacitively coupled plasma processing apparatus, a secondary ground may also be used in addition to the ground electrode. For example, the substrate support 118 can include a bottom electrode which is supplied RF energy at one or more frequencies and process gas can be supplied to the interior of the chamber through showerhead electrode 112 which is a grounded upper electrode. A secondary ground, located outwardly of the bottom electrode in the substrate support 118 can include an electrically grounded portion which extends generally in a plane containing the substrate 120 to be processed but separated from the substrate 120 by an edge ring assembly 200. The edge ring assembly 200 can include edge rings formed from electrically conductive, dielectric, and/or semiconductive material which become heated during plasma generation.

For control of etch rate uniformity on substrate 120 and matching the etch rate at the center of the substrate to the etch rate at the edge of the substrate, substrate boundary conditions are preferably designed for assuring continuity across the substrate in regard to the chemical exposure of the substrate edge, process pressure, temperature, and RF field strength. In order to minimize substrate contamination, the plasma exposed edge ring of the edge ring assembly 200 is preferably manufactured from a material compatible to the substrate itself. Additionally, in order to minimize substrate contamination, the protective liquid layer which is on plasma exposed surfaces of the edge ring assembly is a high purity liquid, and when eroded forms volatile etch by products which can be removed by a vacuum system of the vacuum chamber. The plasma exposed surfaces of the edge ring assembly 200 preferably have a protective liquid layer wherein plasma compatible liquid forming the protective liquid layer is replenished in situ during plasma processing operations, or before plasma processing operations such that the edge ring assembly 200 underlying the protective liquid layer does not erode during the plasma processing operations.

In an alternate embodiment, as illustrated in FIG. 1B, an inductively coupled plasma processing chamber 25, such as the Kiyo built by Lam Research Corporation of Fremont, Calif., in which semiconductor substrates, e.g., silicon wafers, are processed, and wherein components comprising a protective liquid layer on a plasma exposed surface thereof, as discussed herein, may be used. An exemplary embodiment of an inductively coupled plasma processing apparatus may be found in commonly-assigned U.S. Pat. No. 8,025,731, which is incorporated herein in its entirety. A vacuum chamber 10 includes a substrate support 12 for supporting the substrate 120 in the interior of the vacuum chamber 10 wherein the substrate support 12 preferably includes an edge ring assembly 200. A dielectric window 20 forms a top wall of vacuum chamber 10. Process gases are injected to the interior of the vacuum chamber 10 through a gas injector 22. A gas supply 23 supplies process gases to the interior of the vacuum chamber 10 through gas injector 22.

Once process gases are introduced into the interior of vacuum chamber 10, they are energized into a plasma state by an energy source 18 supplying energy into the interior of vacuum chamber 10. Preferably, the energy source 18 is an external planar antenna powered by an RF source 19a and RF impedance matching circuitry 19b to inductively couple RF energy into vacuum chamber 10. An electromagnetic field generated by the application of RF power to planar antenna energizes the process gas to form a high-density plasma (e.g., $10^{10}$-$10^{12}$ ions/cm$^3$) above substrate 120.

Figure 2A:
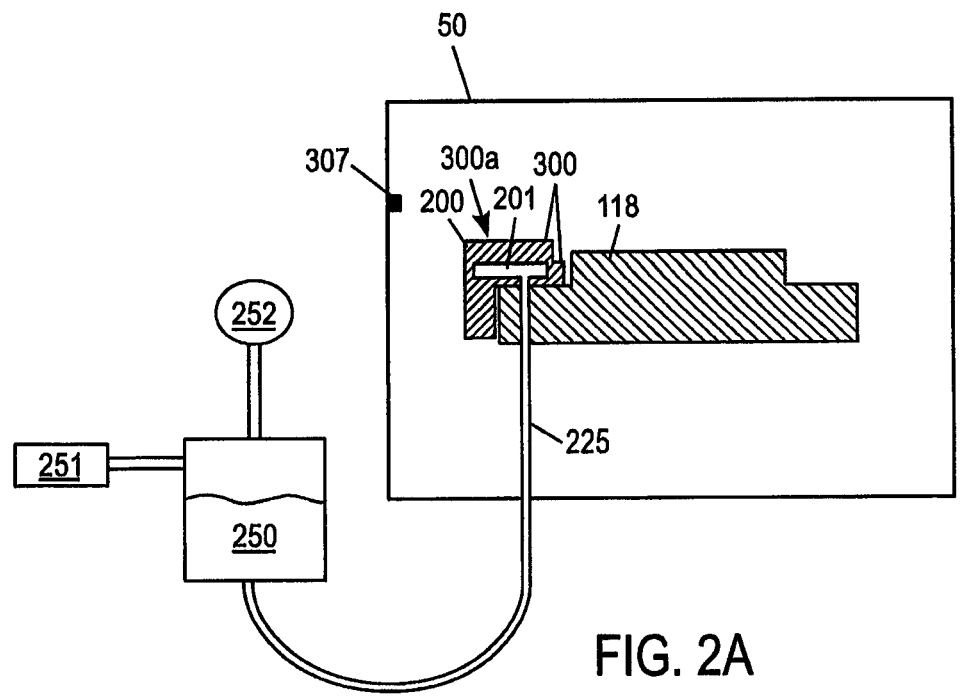

FIG. 2A illustrates an embodiment of an edge ring assembly 200 configured to supply plasma compatible liquid to at least one plasma exposed surface thereof. The edge ring assembly 200 surrounds a substrate support 118 in a vacuum chamber 50 of a plasma processing apparatus. The edge ring assembly 200 includes a liquid channel, such as an annular channel 201 therein, wherein liquid is supplied to the annular channel 201 from a liquid supply 250 through a liquid inflow channel 225. The liquid supply 250 can be connected to a gas supply 252 and/or a pump 251 such that the pressure of the liquid in the liquid supply 250 can be controlled or the liquid in the liquid supply 250 may be pumped. The pressure differential between the liquid supply 250 and/or the pump can force the liquid towards the edge ring assembly 200 and further, force the liquid to flow in the liquid feed passages in the edge ring assembly 200 towards the plasma exposed surface of the edge ring assembly 200. In one embodiment, the edge ring assembly 200 may comprise a porous upper edge ring wherein the annular channel 201 is disposed therein, and the liquid feed passages are pores in the upper edge ring. Preferably the protective liquid layer is formed on a plasma exposed surface of the edge ring, and more preferably the protective liquid layer is formed on each plasma exposed surface of the edge ring. For example, as illustrated in FIG. 2A, a protective liquid layer 300 is on an upper surface 300a of the edge ring assembly 200 wherein the upper surface of the edge ring assembly 200 forms a step. During plasma processing of a substrate, the liquid forming the protective liquid layer is eroded by reactive ions (i.e. ion bombardment) and removed from the chamber as volatile etch by products, such as those utilized in plasma etching, however the liquid forming the protective liquid layer is replenished in situ by continuing to be supplied from the liquid supply 250 to plasma exposed surfaces of the edge ring assembly during plasma processing of the semiconductor substrate. The continuous supply of the liquid to the plasma exposed surfaces of the edge ring assembly which forms the protective liquid layer protects the upper edge ring as well as other components which have plasma exposed surfaces coated by the liquid. The liquid may be supplied such that a predetermined thickness of the protective liquid layer is maintained on plasma exposed surfaces of the edge ring assembly wherein the thickness of the protective layer may be maintained by the pump 252 or the pressure differential between the liquid supply 250 and the vacuum chamber 50. Preferably the protective liquid layer has a thickness of about 0.5 to 4,000 microns and more preferably a thickness greater than about 100 microns. The thickness of the liquid can be determined by a height sensor such as interferometer 307. As used herein the term "about" refers to ±10%.

The porous upper edge ring of the edge ring assembly 200 is preferably formed from aluminum oxide having suitable porosity, e.g. the porosity of the aluminum oxide can be about 1 to 90%, and more preferably the porosity of the aluminum oxide is about 10 to 50%. Alternatively, the porous upper edge ring of the edge ring assembly 200 can be formed from a porous ceramic or glassy material (e.g. zeolite or other material such as aerogels with well-defined porosity) wherein the porosity of the ceramic material is about 1 to 90%, and more preferably the porosity is about 10 and 50%.

In an embodiment, the plasma compatible liquid forming the protective liquid layer on the plasma exposed surface of the edge ring can be configured to flow over the plasma exposed surface and onto plasma exposed surfaces of nearby components. The liquid can flow at a rate sufficient to offset plasma erosion of the liquid layer during plasma processing of the semiconductor substrate. In a further embodiment, an upper edge ring of the edge ring assembly 200 can have a sloped upper surface such that angle of the upper surface can direct the flow of the liquid due to gravitational force.

Figure 2B:
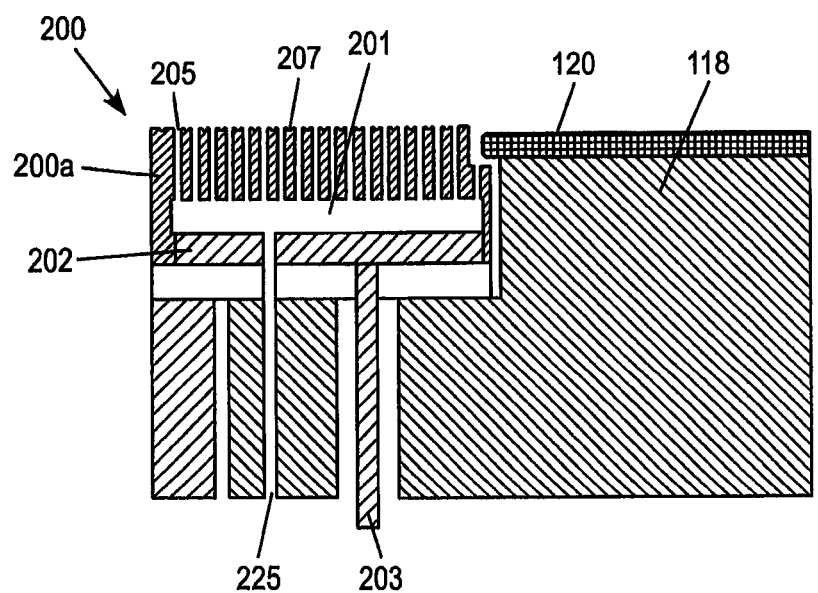

Alternatively, as illustrated in FIG. 2B, an upper edge ring 200a of the edge ring assembly 200 may have an annular zone of closely spaced holes 205 and a liquid channel such as annular channel 201 which supplies the liquid to the holes. The liquid may be delivered from the liquid supply 250 through the liquid inflow channel 225 to the annular channel 201 of the upper edge ring 200a. Then the liquid may travel through holes 205 which are in fluid communication with the annular channel 201 and at least one plasma exposed surface of the upper edge ring 200a, to form a protective liquid layer on the plasma exposed surface of the upper edge ring 200a. Again, during plasma processing of a, substrate, the protective liquid layer on the plasma exposed surfaces is eroded by reactive ions (i.e. ion bombardment such as those utilized in plasma etching, however the liquid of the protective liquid layer is replenished in situ to the plasma exposed surfaces of the upper edge ring 200a during plasma processing of the semiconductor substrate such that the underlying upper edge ring 200a is not eroded.

In an embodiment, the annular zone of closely spaced holes 205 can have any suitable spacing which distributes the liquid across the plasma exposed surface, e.g. the spacing between the holes 205 can be about 0.5 cm to about 1 cm, or about 1 cm to about 3 cm. The holes 205 preferably have a diameter of about 100 microns to about 5 mm. A plasma exposed surface of a component, such as the upper edge ring 200a of the edge ring assembly 200, which is intended to receive the plasma compatible liquid forming the protective liquid layer can optionally be textured to improve distribution of the liquid, e.g., the surface can include microgrooves 207. The microgrooves 207 can be machined in the plasma exposed surface wherein the microgrooves 207 are configured to distribute the liquid completely over the plasma exposed surface of the component, such as upper edge ring 200a.

Additionally, an edge ring assembly 200 can include an RF electrode embedded therein. For example as illustrated in FIG. 2B, an RF electrode 202 forms a lower surface of the upper edge ring 200a. The RF electrode 202 can receive RF power from an RF power supply connection 203 such that the edge ring assembly 200 can provide an RF bias around an outer periphery of a substrate 120 supported on the substrate support 118 during processing of the substrate 120.

Figure 2C:
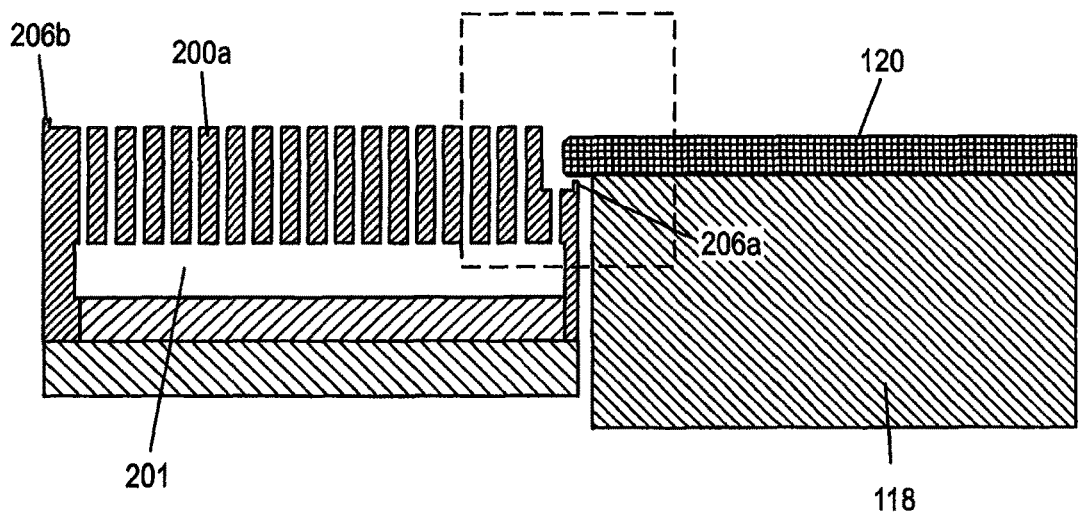
Figure 2D:
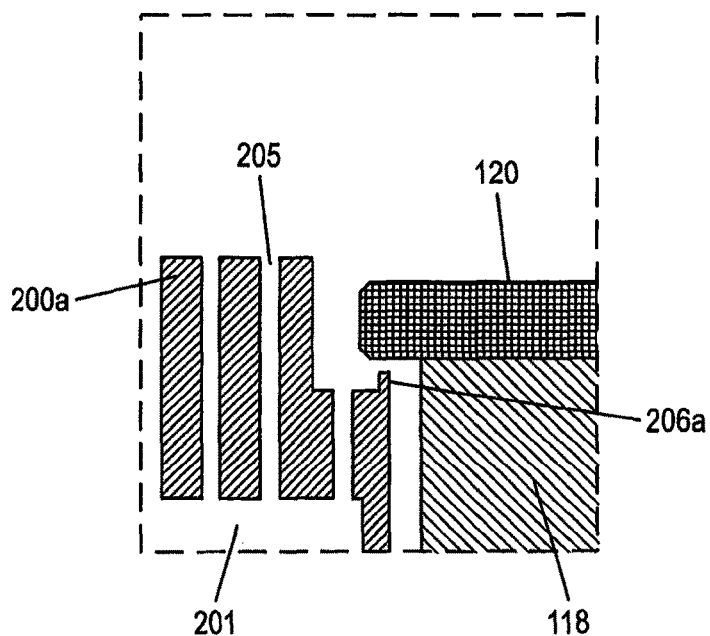

FIGS. 2C and 2D illustrate a further embodiment of the edge ring assembly 200 wherein FIG. 2D is an exploded view of FIG. 2C, As illustrated in FIGS. 2C and 2D, an upper edge ring 200a of the edge ring assembly 200 can include an inner annular lip 206a around an upper surface of the inner periphery of the upper edge ring 200a. The inner annular lip 206a is configured to retain the liquid on the plasma exposed surface of the upper edge ring 200a, such that the liquid may be confined to a desired area and not pool between the edge ring assembly 200 and the substrate support 118. In this embodiment, the inner annular lip 206a is configured to retain the liquid on a lower step of the upper edge ring 200a such that an upper surface and an inner corner of the lower step, and optionally an inner vertical surface of the lower step are covered by the liquid. Alternatively, or in addition to the inner annular lip 206a, the upper edge ring 200a of the edge ring assembly 200 can include an outer annular lip 206b (see FIG. 2C) around an upper surface of the outer periphery of the upper edge ring 200a. The outer annular lip 206b is configured to retain the liquid on the upper surface of the upper edge ring 200a, such that the liquid may be confined to a desired area and not spill onto an outer side surface of the edge ring assembly 200.

Referring back to FIG. 2A, preferably the liquid in the liquid supply 250 is maintained at sub-atmospheric pressure such that when the vacuum chamber 50 is evacuated during processing of a semiconductor substrate, the liquid can flow from the liquid supply 250 to the annular channel 201, and further to one or more plasma exposed surfaces, of the edge ring assembly 200. However, during periods when the vacuum chamber 50 is not evacuated (when not plasma processing substrates), the atmospheric pressure inside the vacuum chamber will force the liquid to remain in the liquid supply 250 due to the pressure differential between the vacuum chamber 50 (at atmospheric pressure) and the liquid in the liquid supply 250 (at sub-atmospheric pressure). Preferably, the liquid supply is maintained at a sub-atmospheric pressure and the pores or the holes in the upper edge ring of the edge ring assembly 200 are optimized such that a pressure greater than about 1 Torr in the liquid supply can enable the liquid to wick and/or flow to the at least one plasma exposed surface of the upper edge ring when pressure in the vacuum chamber is reduced. The pressure differential between the vacuum chamber 50 and the liquid supply 250 may be tuned such that the protective liquid layer is formed on the at least one plasma exposed surface of the upper edge ring to a desired thickness. Preferably the protective liquid layer is about 0.5 to 4,000 microns thick, and more preferably the protective liquid layer is greater than about 100 microns. In an alternative embodiment, the liquid may be pumped from the liquid supply 250 to the annular channel 201.

Figure 2E:
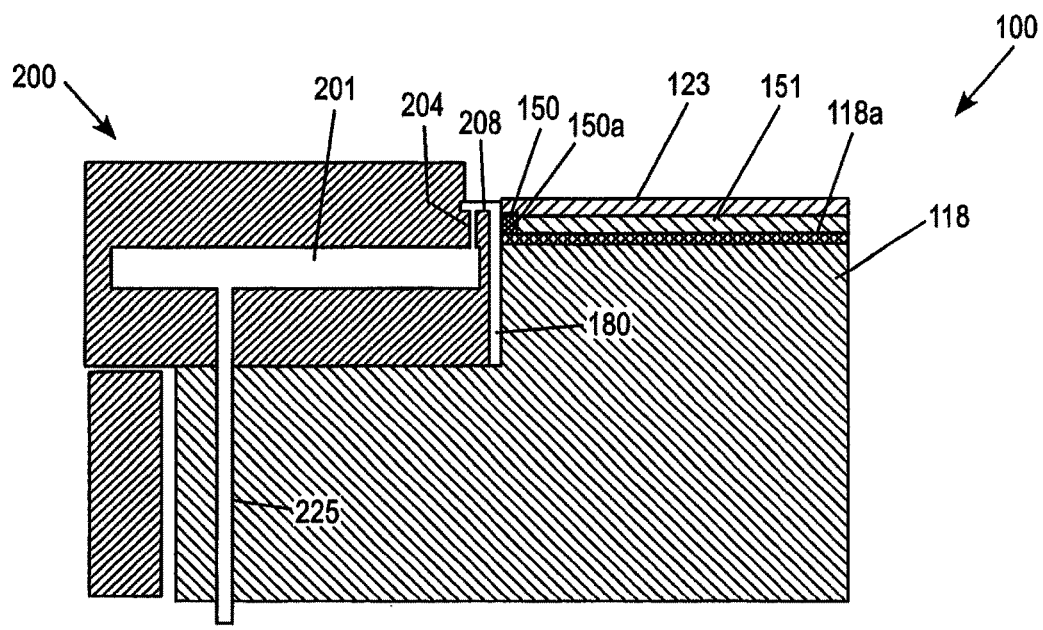
Figure 2F:
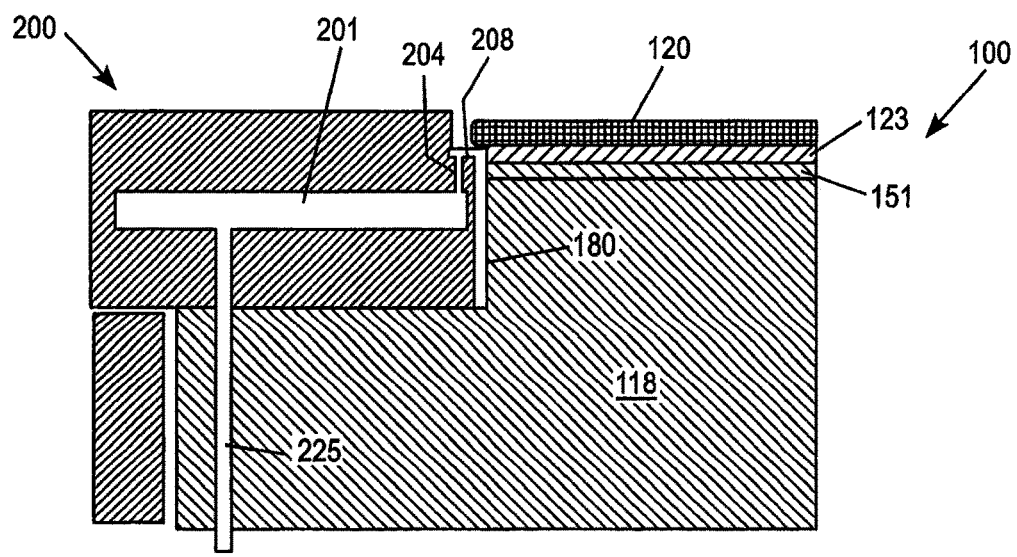

In further embodiments of an edge ring assembly configured to surround a substrate support assembly, the substrate support assembly 100 can include a temperature controlled lower base plate (i.e. substrate support) 118, an upper plate 123, and an optional mounting groove 150a surrounding a bond layer 151 therebetween. For example, as illustrated in FIG. 2E, the substrate support assembly 100 can include an electrostatic chuck (ESC) embedded in a ceramic upper plate 123 which may be bonded by a bond layer 151 to the substrate support 118 or a heater layer 118a of the substrate support 118. A mounting groove 150a can surround the bond layer 151 of the substrate support assembly 100. An edge seal 150 such as an elastomer ring can be mounted in the groove 150a. During plasma processing, the liquid can be supplied through feed passages in an inner step of the edge ring and the liquid can be fed at a rate sufficient to flow over the inner edge of the edge ring until the edge seal 150 is covered by the plasma compatible liquid. Edge seals which can be mounted in the mounting groove include an O-ring such as an elastomer ring, epoxy, silicone, or the like. The liquid may be delivered from the liquid supply through the liquid inflow channel 225 to the annular channel 201 in the edge ring assembly 200. The upper edge ring of the edge ring assembly 200 preferably has a step around an inner periphery thereof, wherein at least one hole 204 delivers the liquid to an inner step 208 of the stepped surface such that the liquid forms a protective liquid layer on the inner step 208 of the stepped surface. The liquid additionally flows into a gap 180 between the substrate support 118 and the edge ring assembly 200. The liquid pooling in the gap 180 covers the edge seal 150 mounted in the mounting groove surrounding the bond layer 151 in the substrate support 118 wherein the protective liquid layer is replenished in situ during plasma processing of the semiconductor substrate 120 such that the bond layer 151 is not eroded during plasma processing of a semiconductor substrate. Additionally, the liquid may travel from the annular channel 201 through holes or pores in an upper edge ring of the edge ring assembly 200 to at least one, but preferably each plasma exposed surface of the edge ring assembly 200. Alternatively, as illustrated in FIG. 2F, an edge seal may not be mounted in the mounting groove such that it surrounds the bond layer 151. In this instance, the liquid can be supplied to an inner step 208 of the stepped surface such that the protective liquid layer forms on the inner step 208 of the stepped surface. The liquid additionally pools in a gap 180 between the substrate support 118 and the edge ring assembly 200. The liquid completely submerges and covers the bond layer 151, thus eliminating the need for an edge seal. The liquid forming the protective liquid layer is also replenished in situ during plasma processing of the semiconductor substrate 120, wherein the liquid may be supplied such that the bond layer 151 remains covered and is not eroded during plasma processing of a semiconductor substrate.

Figure 2G:
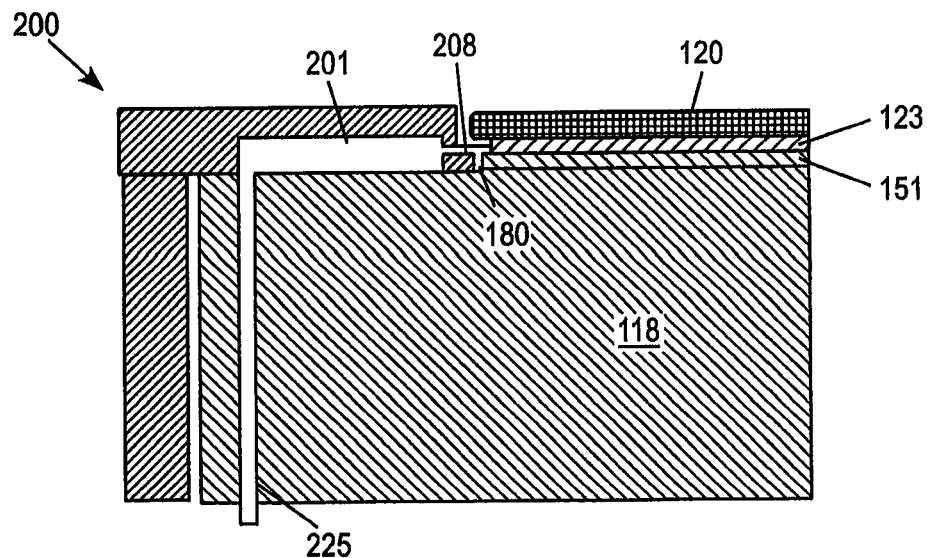
Figure 2H:
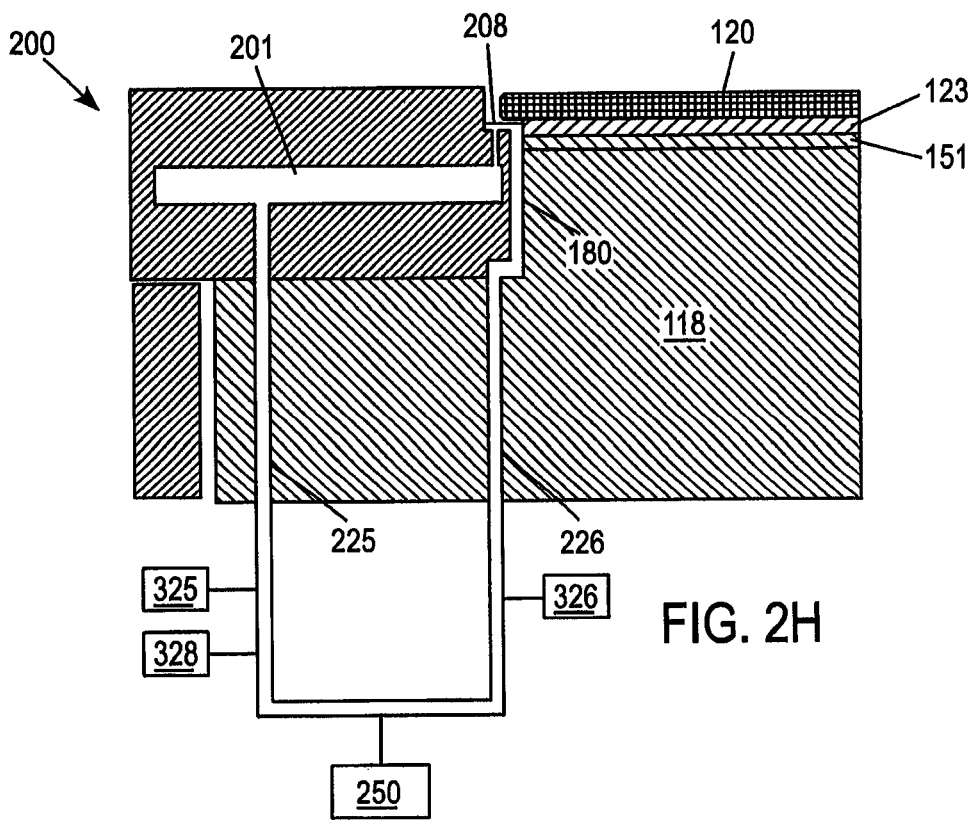

In an embodiment, the bond layer 151 can be formed such that there is room for a mounting groove (see FIG. 2E) at an outer perimeter of the bond layer between the upper ceramic plate 123 and the substrate support 118, however in alternate embodiments, the bond layer 151 can be formed such that the outer perimeter of the bond layer is flush with an outer perimeter of the upper ceramic plate 123 (see FIG. 2F). In this instance, the liquid can be supplied to an inner step 208 of the stepped surface such that the protective liquid layer forms on the inner step 208 of the stepped surface wherein the liquid additionally pools in the gap 180 between the substrate support 118 and the edge ring assembly 200 such that a protective liquid layer covers the bond layer 151. However, in a further embodiment, as illustrated in FIG. 2G, an outer perimeter of the bond layer 151 may extend beyond the outer perimeter of the upper ceramic plate 123 wherein extending the bond layer 151 beyond the outer perimeter of the upper ceramic plate 123 may increase temperature uniformity across a substrate 120 supported on the upper ceramic plate 123. In this embodiment, the liquid can be supplied to an inner step 208 of the stepped surface such that the protective liquid layer covers the inner step 208 of the stepped surface Wherein the liquid may pool in the gap 180 between the substrate support 118 and the edge ring assembly 200 such that a protective liquid layer forms upon and submerges the bond layer 151.

In the embodiment wherein liquid is pooled in gap 180, the liquid supplied from the liquid supply is preferably continuously added to an upper portion of the protective liquid layer and removed from a lower portion of the protective liquid layer during plasma processing of the semiconductor substrate such that liquid may be circulated and further such that the thickness of the protective liquid layer can be controlled. For example a plasma exposed surface of a component, such as an edge ring, can be adjacent a substrate support assembly wherein the substrate support assembly is configured to support the semiconductor substrate. The protective liquid forming the protective liquid layer can be supplied to the plasma exposed surface of the edge ring such that the protective liquid pools in a gap between the edge ring and the substrate support, and forms an annular liquid layer around the substrate support. The liquid layer is preferably maintained at a thickness sufficient to provide a predetermined gap between a surface of the liquid layer exposed to the plasma and a lower surface at an outer periphery of a semiconductor substrate processed by the plasma.

FIG. 2H illustrates a further embodiment of the edge ring assembly 200 wherein liquid can be recirculated. For example, the edge ring assembly 200 can include a liquid inflow channel 225 and a liquid outflow channel 226. The liquid forming the protective liquid layer, can be circulated to or from the edge ring assembly 200 such that the desired thickness of the protective liquid layer, as well as an amount of liquid pooled in the gap 180 between the substrate support 118 and the edge ring assembly 200 can be controlled. Furthermore, when circulated, the liquid can be directed through a filter 326, such that harmful impurities, which may be acquired by the liquid during plasma processing of a substrate, may be removed. The liquid can also be directed through a heat exchanger 325, so as to heat or cool the liquid such that the temperature of the edge ring assembly 200 can be controlled during plasma processing of a substrate.

Figure 2I:
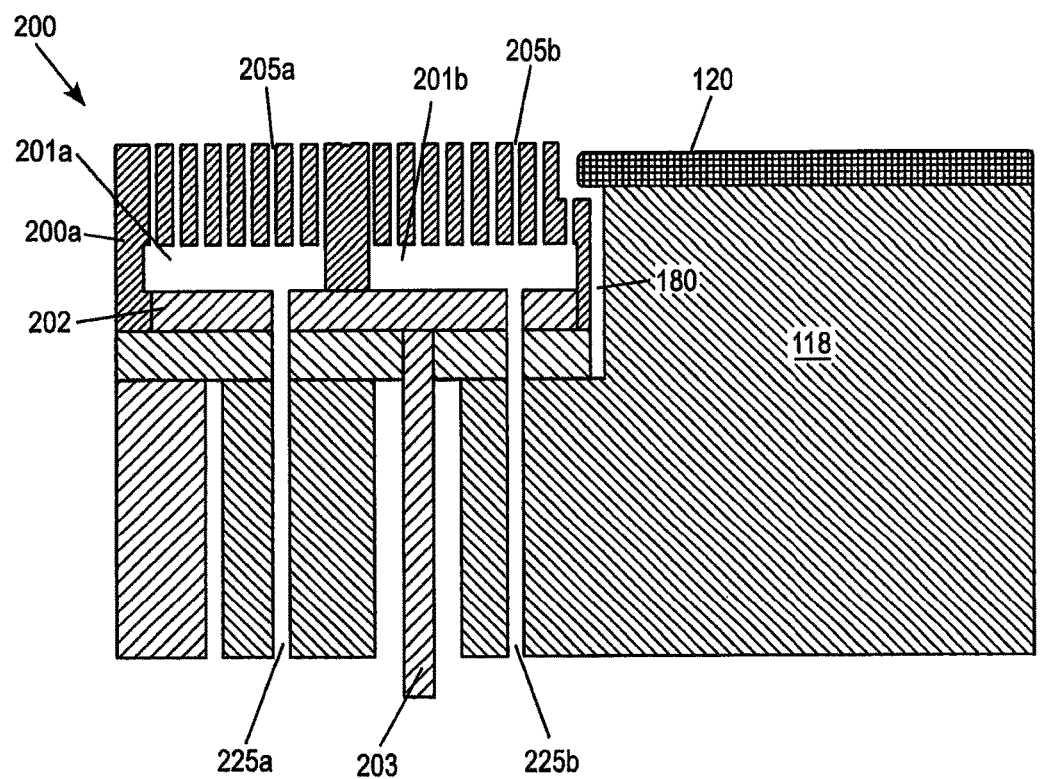

In a next embodiment, as illustrated in FIG. 2I, an upper edge ring 200a of the edge ring assembly 200 may have more than one liquid channel such as a first annular channel 201a and a second annular channel 201b formed therein. A first plasma compatible liquid may be delivered from the liquid supply through a liquid inflow channel 225a to the annular channel 201a of the upper edge ring 200a, and a second plasma compatible liquid may be delivered from the liquid supply through a liquid inflow channel 225b to the annular channel 201b of the upper edge ring 200a. The first liquid may travel through holes 205a which are in fluid communication with the first annular channel 201a and the plasma exposed surface of the upper edge ring 200a, and the second liquid may travel through holes 205b which are in fluid communication with the second annular channel 201b. The first and second liquids can combine on the plasma exposed surface of the upper edge 200a wherein the first and second liquids react to form a protective solid layer on the plasma exposed surface of the upper edge ring 200a of the edge ring assembly 200, Again, during plasma processing of a substrate, the protective liquid layer or alternatively the protective solid layer on the plasma exposed surface is eroded by reactive ions (i.e. ion bombardment), such as those utilized in plasma etching. The liquid of the protective liquid layer can be replenished in situ to the plasma exposed surface of the upper edge ring 200a during plasma processing of the semiconductor substrate such that the underlying edge ring assembly is not eroded. Alternatively, in an embodiment wherein the protective solid layer is on the plasma exposed surface of the upper edge ring 200a, erosion due to the reactive ions can remove portions of the protective solid layer on the upper edge ring 200a, thus exposing portions of the upper edge ring 200a and opening the liquid feed passages therein. Upon opening of the liquid feed passages, liquid can be replenished to the plasma exposed surface of the upper edge ring 200a wherein the liquid can be used to form the protective solid layer. The liquid or liquids used to form the protective solid layer may be supplied and cured on the plasma exposed surface before a batch of semiconductor substrates is processed.

Figure 2J:
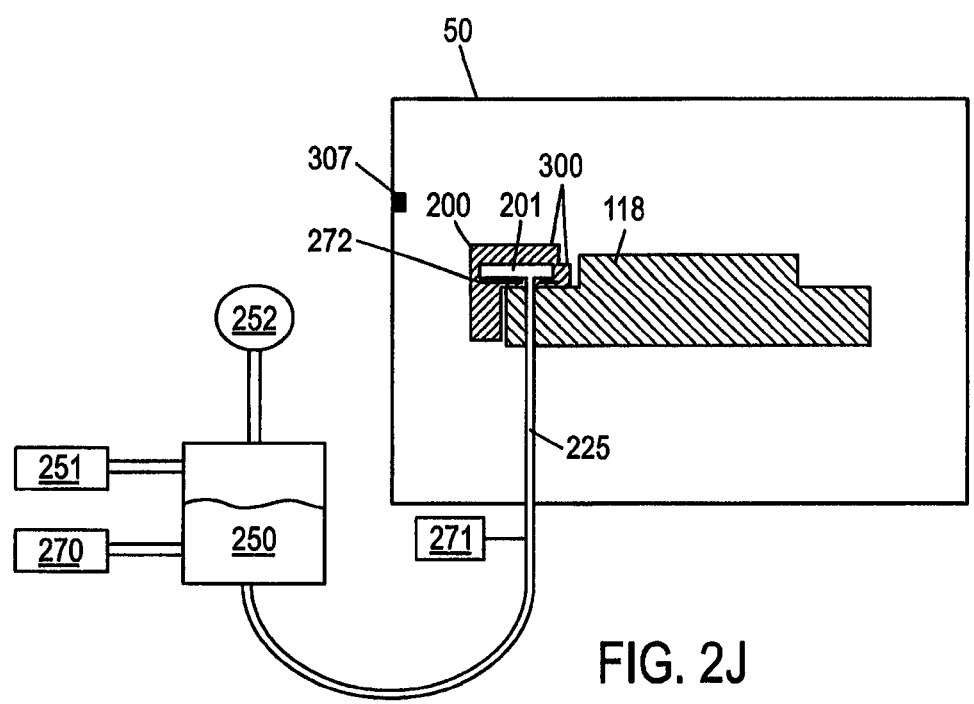

In an embodiment, the plasma compatible liquid can form a plasma compatible solid at temperatures below about 80° C., and more preferably at temperatures below about 120° C. For example, as illustrated in FIG. 2J, the liquid supply 250 can include a heater 270 which can be configured to heat a plasma compatible solid to form the plasma compatible liquid. The plasma compatible liquid can then be supplied through the liquid inflow channel 225 to the annular channel 201, wherein the plasma compatible liquid can be supplied through liquid feed channels to the plasma exposed surface of the component, such as edge ring assembly 200, thereby forming a protective liquid layer thereon. The protective liquid layer may then cool to form a protective solid layer. In a preferred embodiment, the liquid inflow channel and the edge ring assembly 200 are temperature controlled. For example, the liquid inflow channel 225 can include an optional heater 271 and the upper edge ring or a lower edge ring of the edge ring assembly 200 can include an optional heater 272. Alternatively, or in addition to the heaters 271, 272, the edge ring assembly 200 can be temperature controlled by the substrate support 118 wherein the edge ring assembly 200 is heat sunk to the substrate support 118 (i.e. a temperature controlled base plate).

During plasma processing of a substrate, the protective solid layer on the plasma exposed surface is eroded by reactive ions (i.e. ion bombardment), such as those utilized in plasma etching. The protective solid layer can be replenished to the plasma exposed surface of the component, such as edge ring assembly 200, wherein the protective solid layer and the plasma compatible solid material in the liquid supply 250, liquid inflow channel 225, and the edge ring assembly 200 including the annular channel 201 is heated to form the plasma compatible liquid. The plasma compatible liquid can then be resupplied to a plasma exposed surface of the edge ring assembly 200. The plasma compatible liquid can then form a protective liquid layer on the plasma exposed surface of the component which can be cooled to form a protective solid layer thereon.

Figure 3A:
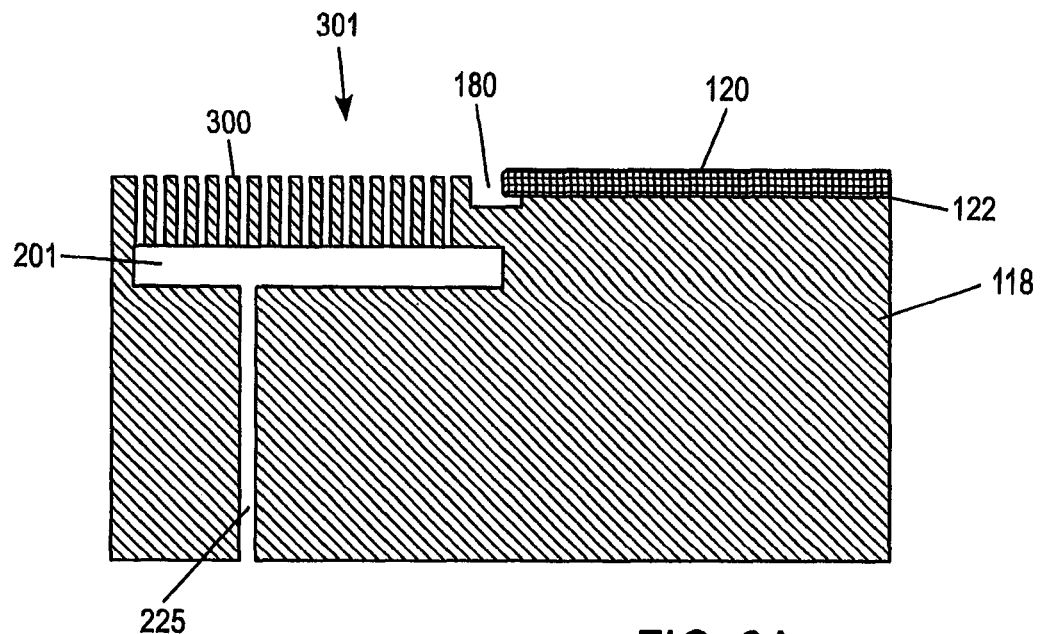
Figure 3B:
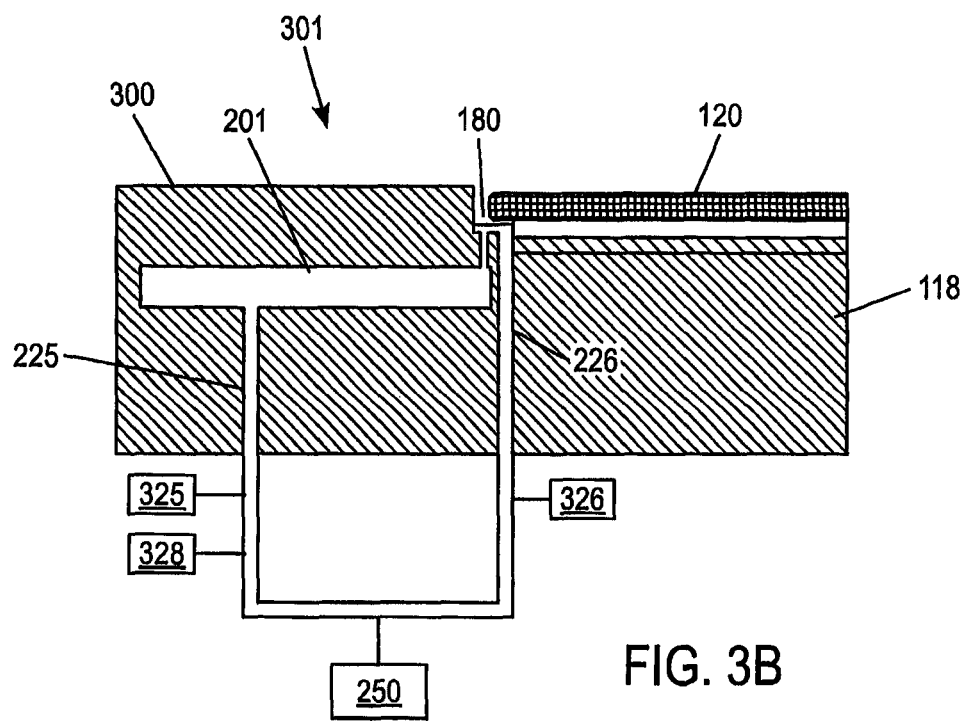

In an alternative embodiment, the component including means for supplying a protective liquid layer on a plasma exposed surface thereof can be a substrate support. FIG. 3A illustrates a substrate support 118 for use in a vacuum chamber of a plasma processing apparatus. The substrate support 118 includes a substrate support surface 122 which supports a semiconductor substrate 120 in overhanging relation to a recess (gap) 180 in an upper surface of the substrate support 118. A plasma exposed surface 301 of the substrate support 118 is configured to surround the recess 180. The substrate support 118 includes a liquid channel, such as annular channel 201, which is in fluid communication with a liquid inflow channel 225 and an optional liquid outflow channel 226 (see FIG. 3B). Liquid can be supplied to the annular channel 201 wherein the liquid can be forced through liquid feed passages in the substrate support 118 to the plasma exposed surface 301 thereof, thereby forming a protective liquid layer 300 on the plasma exposed surface 301 of the substrate support 118. Further, as illustrated in FIG. 3B, the liquid can be circulated, to or from the substrate support 118 such that the desired thickness of the protective liquid layer, as well as an amount of liquid pooled in recess 180 formed in the substrate support 118 can be controlled. When circulated, the liquid can be directed through a filter 326 such that harmful impurities, which may be acquired by the liquid during plasma processing of a substrate, may be removed. The liquid can also be directed through a heat exchanger 325, so as to heat or cool the liquid such that the temperature of portions of the substrate support 118 which are in thermal contact with the liquid can be controlled during plasma processing of a substrate 120. Additionally, the liquid at the liquid-plasma interface which becomes charged from plasma exposure during plasma processing processes may be circulated through an electrical discharge conduit 328 which removes charge built up in the liquid.

Figure 3C:
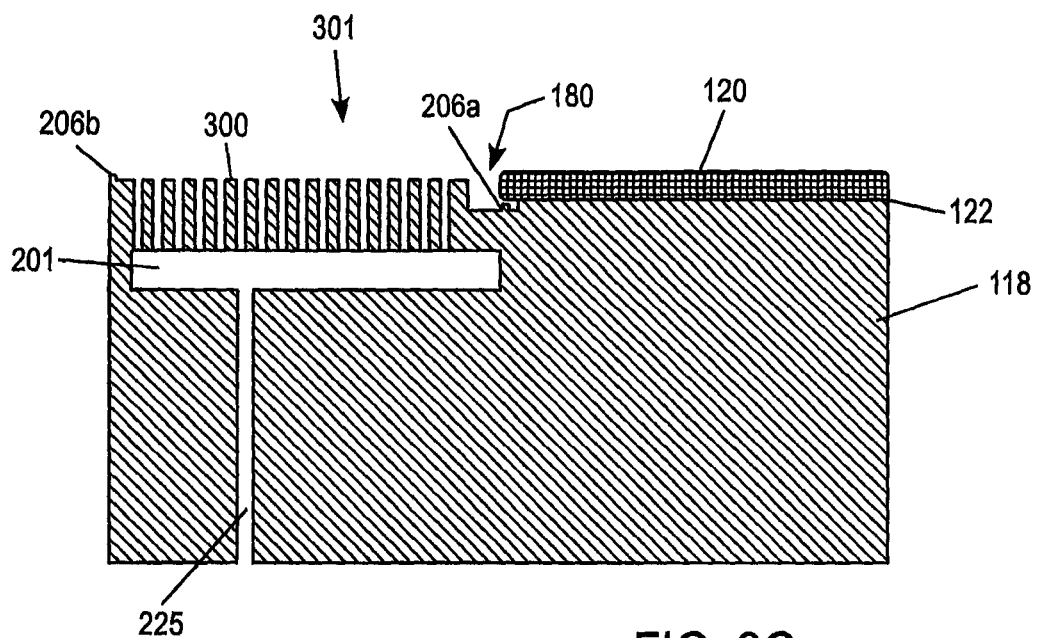
Figure 3D:
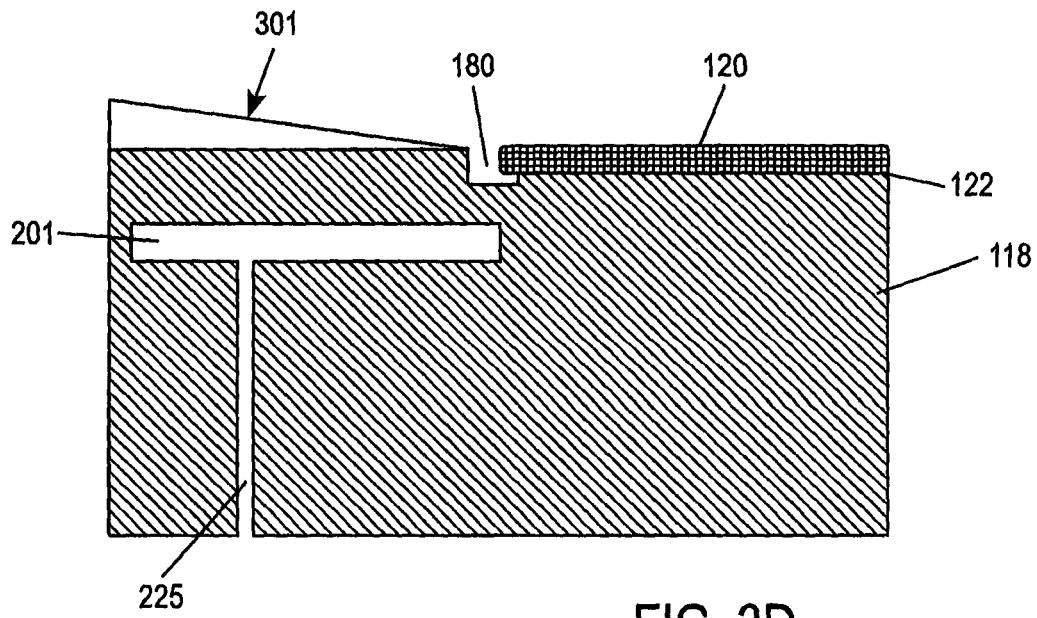

As illustrated in FIG. 3C, the plasma exposed surface 301 of the substrate support 118 can include an inner annular lip 206a formed in the recess 180 thereof. The inner annular lip 206a is configured to retain the liquid on the plasma exposed surface of the substrate support 118, such that the liquid may be confined to a desired area. In this embodiment, the inner annular lip 206a is configured to retain the liquid on a lower step of the substrate support 118 wherein the step is defined by the recess 180 such that an upper surface and an inner corner of the lower step, and optionally an inner vertical surface of the lower step are covered by the liquid. Alternatively, or in addition to the inner annular lip 206a, the plasma exposed surface 301 of the substrate support 118 can include an outer annular lip 206b around an upper surface of the outer periphery of the substrate support 118. The outer annular lip 206b is configured to retain the liquid on the upper surface of the substrate support 118, such that the liquid may be confined to a desired area and not spill onto an outer side surface of the substrate support 118. In a further embodiment, as shown in FIG. 3D, the plasma, exposed surface 301 of the substrate support 118 can have a sloped upper surface such that angle of the upper surface can direct the flow of the liquid due to gravitational force.

Additionally presented herein is a method of plasma processing a semiconductor substrate in a plasma processing apparatus, such as a plasma etching chamber, wherein the plasma processing apparatus includes a component with a protective liquid layer such as an edge ring assembly. The method includes supplying a process gas from a process gas source into the vacuum chamber, applying RE energy to the process gas using the RF energy source to generate plasma in the vacuum chamber, and plasma processing the semiconductor substrate in the vacuum chamber. While plasma processing the substrate, a liquid is replenished on at least one plasma exposed surface of the component, such as an upper edge ring of the edge ring assembly. In a further embodiment, the liquid supplied to plasma exposed surfaces of the edge ring assembly may be controlled such that a liquid may be paired with a process gas recipe, for a specific processing step. Additionally, the liquid supply can independently supply two or more liquids which react to form a solid protective layer on the at least one plasma exposed surface of an upper edge ring configured to surround the semiconductor substrate supported on the substrate support in the vacuum chamber.

Components including means for supplying a plasma compatible liquid to a plasma exposed surface thereof so as to form a protective liquid layer thereon can be used to support plasma etching and/or deposition processes performed on semiconductor substrates in plasma processing apparatuses. Preferably, the plasma processing apparatus can be a capacitively coupled plasma processing apparatus, inductively coupled plasma processing apparatus, electron cyclotron resonance plasma processing apparatus, helicon wave plasma processing apparatus, or a microwave plasma processing apparatus.

While the component with protective liquid layer on a plasma exposed surface thereof has been described in detail with reference to specific embodiments thereof, it will be apparent to those skilled in the art that various changes and modifications can be made, and equivalents employed, without departing from the scope of the appended claims.

What is claimed is:

1. A method of forming an in situ protective solid layer on a plasma exposed surface of a component in a plasma processing apparatus configured to process a semiconductor substrate in a vacuum chamber, the method comprising:
   heating a plasma compatible solid to form a plasma compatible liquid;
   supplying the plasma compatible liquid through liquid feed channels in the component to the plasma exposed surface of the component so as to form a protective liquid layer on the plasma exposed surface of the component; and
   cooling the protective liquid layer on the plasma exposed surface of the component thereby forming the protective solid layer.

2. The method of claim 1, further comprising plasma processing the semiconductor substrate in the vacuum chamber.

3. The method of claim 1 wherein the heating the plasma compatible solid includes heating the plasma compatible solid using a heater of a liquid supply.

4. The method of claim 1 further comprising heating the plasma compatible liquid using a heater of a liquid inflow channel through which the plasma compatible liquid flows.

5. The method of claim 1 further comprising heating the plasma compatible liquid using a heater of an upper edge ring.

6. The method of claim 1 further comprising heating the plasma compatible liquid using a heater of a lower edge ring.

7. The method of claim 1 further comprising heating the plasma compatible liquid using an edge ring assembly.

8. The method of claim 7 wherein the edge ring assembly is heat sunk to a substrate support.

9. The method of claim 1 wherein the component is an edge ring assembly.

* * * * *